United States Patent [19]

Yokoyama

[11] 4,199,931
[45] Apr. 29, 1980

[54] CONNECTION TERMINAL CONSTRUCTION FOR DRIVING COILS OF ELECTRONIC TIMEPIECES

[75] Inventor: Akira Yokoyama, Higashiyamato, Japan

[73] Assignee: Citizen Watch Co. Ltd., Tokyo, Japan

[21] Appl. No.: 919,855

[22] Filed: Jun. 28, 1978

[51] Int. Cl.² .................. G04C 3/00; G04B 33/00; G04B 29/02; H02K 11/00
[52] U.S. Cl. .................. 368/318; 368/88; 58/59; 58/104; 310/68 R; 310/71; 361/397; 361/412
[58] Field of Search ............ 58/23 R, 23 D, 52, 59, 58/104; 310/DIG. 6, 66, 68 R, 71, 179; 361/397, 398, 408, 412

[56] References Cited

U.S. PATENT DOCUMENTS

| Re. 29,403 | 9/1977 | Yamazaki | 58/23 D |
|---|---|---|---|
| 3,778,999 | 12/1973 | Vuffray | 58/23 R |
| 4,024,677 | 5/1977 | Meister et al. | 58/23 R |

*Primary Examiner*—Edith S. Jackmon
*Attorney, Agent, or Firm*—Sherman & Shalloway

[57] ABSTRACT

A connection terminal construction for connecting a driving coil terminal of an electro-mechanical converter such as a step motor or the like of electronic timepieces to an output terminal of a wiring circuit is disclosed. The construction comprises a terminal base formed of a flexible print substrate and provided at least one of upper and lower surfaces thereof with connection patterns. The terminal base is extended toward a circuit substrate substantially in alignment therewith and secured thereto by means of a screw.

7 Claims, 6 Drawing Figures

CONNECTION TERMINAL CONSTRUCTION FOR DRIVING COILS OF ELECTRONIC TIMEPIECES

BACKGROUND OF THE INVENTION

1. Field of the Invention

This invention relates to a connection terminal construction for connecting a driving coil terminal of an electro-mechanical converter such as a step motor or the like of electronic timepieces to an output terminal of a driving circuit.

2. Description of the Prior Art

Such conventional connection terminal construction has the drawbacks that there is risk of connection springs for connecting the driving coil terminal to the output terminal being deformed, thereby inducing a connection separation failure, that the connection terminal construction is large in size and thick in thickness, and that the driving coil could not be detachably mounted on a base plate without detachably mounting the circuit substrate on the base plate.

In greater detail, usually a hand display type crystal wrist watch is provided with a core on which a coil is wound for driving a motor and a circuit substrate on which an integrated circuit, a chip condenser for an oscillating circuit, a trimmer condenser and crystal oscillating element etc. are mounted. In this case, the circuit substrate is generally provided at the front side of a wheel train supporting member, i.e. at the side of a back cover. Ordinarily wiring patterns are formed on the front surface of the circuit substrate. Because this structure provides a structural advantage that the circuit substrate is aligned in parallel with the wheel train supporting member, of which the front surface is relatively even. Further, it enables the easy increase of assembling density that there are provided on the rear side of the wheel train supporting member, the trimmer condenser, integrated circuit chip and chip condenser which are not even and frequently operated. As the result, this structure is advantageous.

Furthermore in view of convenience in checking and operation etc. a terminal of the coil is always fixed to a lead at the front side of a bobbin by soldering or welding, and the lead is connected to a driving terminal on the circuit substrate. However, there arises a problem how the lead is electrically connected in detouchable and reliable structure. When the above described surfaces are different in height, it is required to arrange the lead of the upper surface of the bobbin under any insulation member in order to screw the lead on the side of the bobbin to the lead on the circuit substrate by means of a screw. As the result, the conventional device is expensive.

SUMMARY OF THE INVENTION

This invention can solve the above described problems and provides a structure simple in construction, cheap in cost and high in reliability wherein the member required to connect the upper surface with the lower surface may be obviated by connecting in advance the terminal of the coil to the lead not positioned on the upper surface.

An object of the invention, therefore, is to provide a connection terminal construction for driving coils of electronic timepieces, which can eliminate the above mentioned drawbacks, i.e., which is simple in assembling and reliable in operation.

A feature of the invention is the provision of a connection terminal construction for driving coils of electronic timepieces comprising a base plate, a circuit substrate mounted on said base plate and provided thereon with wiring patterns, a terminal base mounted on said circuit substrate and provided with holes extending therethrough, said terminal base being provided at least one of upper and lower surfaces thereof with connection patterns, a driving coil mounted on said base plate and connected through said holes provided in said coil terminal sheet and through said connection patterns provided thereon to said wiring patterns provided on said circuit substrate, and an extension including said terminal base and said connection pattern, and projecting toward said circuit substrate substantially in alignment therewith, said extension being detachably mounted on said circuit substrate.

BRIEF DESCRIPTION OF THE DRAWINGS

The invention will now be described in greater detail with reference to the accompanying drawings, wherein.

DESCRIPTION OF THE PREFERRED EMBODIMENT

Figure 1:
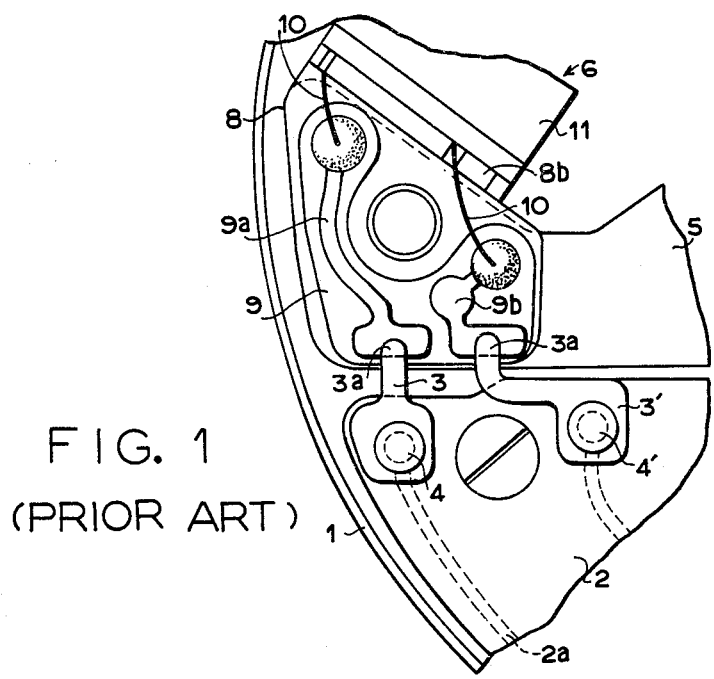
FIG. 1 is a plan view of a conventional connection terminal construction for driving coils of electronic timepieces.
Figure 2:
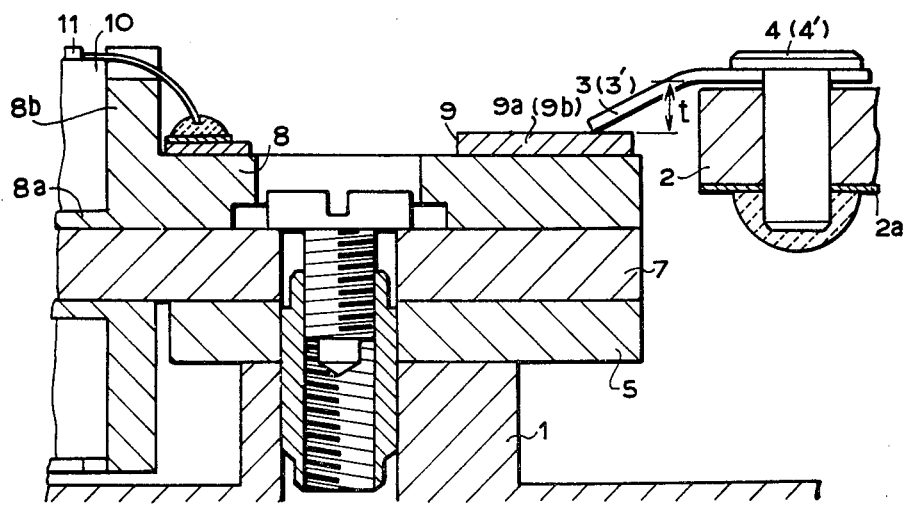
FIG. 2 is its longitudinal sectional view.

FIGS. 1 and 2 show a conventional connection terminal construction for driving coils of electronic timepieces. Referring to FIGS. 1 and 2, reference numeral 1 designates a base plate; 2 a circuit substrate formed of glass epoxy resin and provided with a wiring pattern 2a formed of a copper foil thereon; 3, 3' connection springs each formed of a highly resilient material such as bronze, beryllium copper or the like and secured to that portion of the wiring pattern 2a provided on the circuit substrate 2 which corresponds to the output terminal by means of rivets 4, 4'; 5 a step motor stator formed of a highly permeable material such as permalloy or the like and secured to the base plate 1; and 6 a driving coil of the step motor. The driving coil 6 is composed of a coil winding core body 7 formed of a highly permeable material such as permalloy or the like, a bobbin 8 formed of nylon resin mold and including a winding portion 8a and a reel 8b both made integral with the bobbin 8, a terminal base in the form of a coil terminal sheet 9 consisting of a flexible print substrate and secured to the bobbin 8, and a conductor 10 wound on the winding portion 8a and having starting and final ends soldered to the wiring patterns 9a, 9b provided on the coil terminal sheet 9. The conductor 10 is protected by a cementing agent. Reference numeral 11 designates a protecting tube fitted around the winding portion 8a so as to protect the conductor 10.

As seen from the above, in order to connect the driving coil 6 to the output terminal, the front ends 3a, 3a' of the connection springs 3, 3' are brought into contact with the wiring patterns 9a, 9b provided on the coil terminal sheet 9. As a result, if the connection terminal construction is subjected to strong shocks, the connection springs 3,3' become deformed, thereby inducing a connection separation failure. As a result, such conventional connection terminal construction is not reliable in operation.

In addition, since the connection springs, 3, 3' are required to be urged against the wiring patterns 9a, 9b provided on the coil terminal sheet 9 with a sufficiently high resilient force, the connection springs 3, 3' are subjected to a bending working process as shown in FIGS. 1 and 2 so as to locate the upper surface of the circuit substrate 2 at a position which is higher than the upper surface of the coil terminal sheet 9 by a distance (t). Such construction renders it difficult to make the connection terminal construction small in size and thin in thickness.

In addition, in the case of detachably mounting the driving coil 6 on the base plate 1, it is also necessary to detachably mount the circuit substrate 2 on the base plate 1. As a result, it is very troublesome in replacing the driving coil 6 which has been broken, for example, with a new one.

In order to eliminate the above mentioned drawbacks, the invention provides the following novel connection terminal construction for driving coils.

Figure 3:
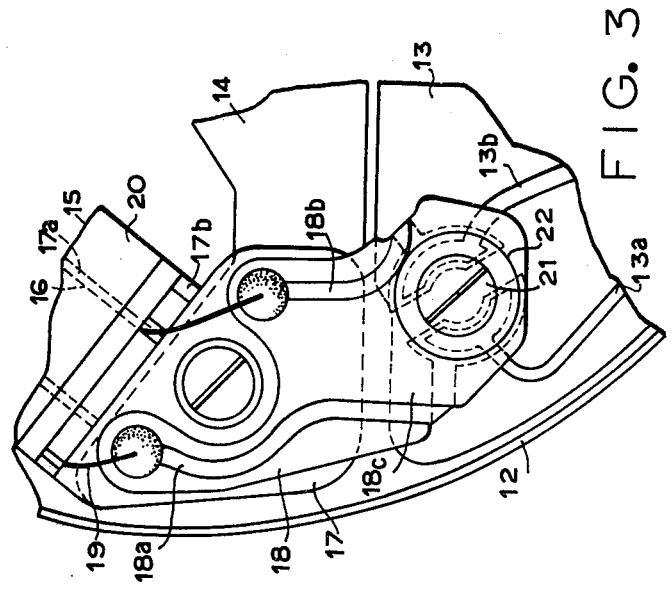
FIG. 3 is a plan view of one embodiment of a connection terminal construction for driving coils of electronic timepieces according to the invention.

FIG. 3 shows a plan view of main parts of an electronic wrist watch to which is applied one embodiment of a connection terminal construction for driving coils according to the invention. Referring to FIG. 3, reference numeral 12 designates a base plate; 13 a circuit substrate provided thereon with wiring patterns 13a, 13b; 14 a step motor stator secured to the base plate 12; and 15 a driving coil of the step motor.

The driving coil 15 is composed of a bobbin body 16 formed of a highly permeable material such as permalloy or the like, a bobbin 17 molded on the bobbin body 16 and including a winding portion 17a and a reel 17b both made integral with the bobbin 17, a terminal base in the form of a coil terminal sheet 18 formed of a flexible print substrate and secured to the bobbin 17, and a conductor 19 wound on the winding portion 17a and having starting and final ends soldered to the winding patterns 18a, 18b on the coil terminal sheet 18, the conductor 19 being protected by a cementing agent (not shown). Reference numeral 20 designates a protecting tube for protecting the conductor 19 wound on the winding portion 17a. The coil terminal sheet 18 is provided at its free end with an extension 18c projected toward the circuit substrate 13 in alignment therewith and disposed on the upper surface of the circuit substrate 13, the extension 18c being secured to the circuit substrate 13 by means of a screw 21. The front ends of the connection patterns 18a, 18b provided on the coil terminal sheet 18 are bent from their upper surface toward the lower surface thereof and formed into an arcuate segment surrounding the screw 21. The front ends of the wiring patterns 13a, 13b provided on the upper surface of the circuit substrate 13 are also formed into an arcuate segment surrounding the screw 21 and made into contact with the arcuate segment of each of the connection patterns 18a, 18b. Reference numeral 22 designates a washer formed of plastic material.

The above described measures of providing the connection patterns 18a, 18b on both the upper and lower surfaces of the coil terminal sheet 18 and of providing the extension of the coil terminal sheet 18 provides the important advantage that the coil terminal sheet 18 partly disposed on the circuit substrate 13 can be electrically connected to the circuit substrate 13 under a stable firmly secured condition, and that the driving coil 15 can detachably mounted on the base plate 12 without removing the circuit substrate 13.

Figure 4:
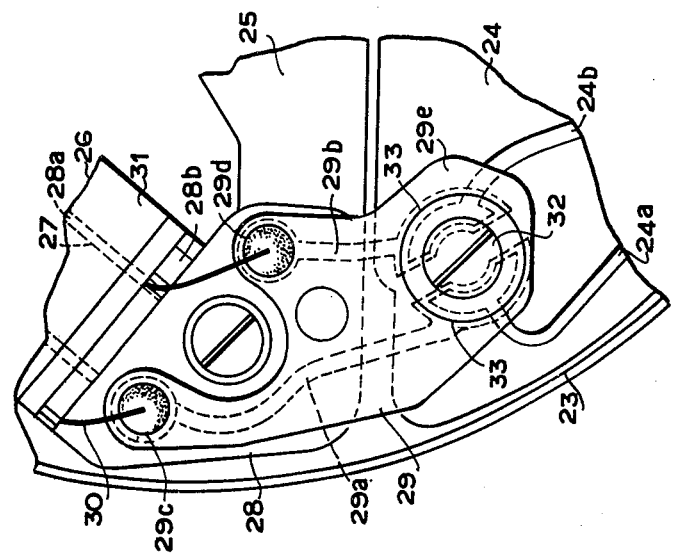
FIG. 4 is a plan view of another embodiment of a connection terminal construction for driving coils of electronic timepieces according to the invention.
Figure 5:
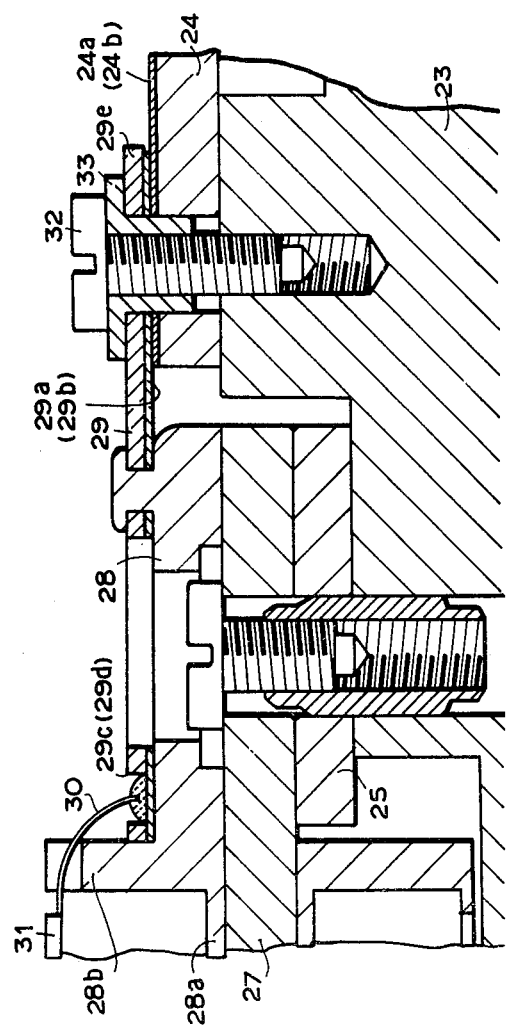
FIG. 5 is its longitudinal sectional view.

FIG. 4 is a plan view of main parts of an electronic wrist watch to which is applied another embodiment of a connection terminal construction for driving coils according to the invention and FIG. 5 is a longitudinal cross sectional view of FIG. 4. Referring to FIGS. 4 and 5, reference numeral 23 designates a base plate; 24 a circuit substrate mounted on the base plate 23 and provided thereon with wiring patterns 24a, 24b; 25 a step motor stator mounted on the base plate 23; and 26 a driving coil of the step motor. The driving coil 26 is composed of a bobbin body 27 formed of a highly permeable material such as permalloy or the like, a bobbin 28 formed of a nylon resin mold and provided with a winding portion 28a and a reel 28b both made integral with the bottom 28, and a terminal base in the form of a coil terminal sheet 29 consisting of a flexible print substrate and secured to the bobbin 28 by heat and pressure bonding such as a hot caulking process. The coil terminal sheet 29 is provided at its lower surface with connection patterns 29a, 29b each formed of a copper foil and to which are soldered starting and final ends of a conductor 30 which is protected by a cementing agent.

As shown in FIG. 5, in order to solder the starting and final ends of the conductor 30 to the connection patterns 29a, 29b, respectively, the coil terminal sheet 29 is provided with holes 29c, 29d to expose the patterns 29a, 29b. As a result, it is possible to directly solder the starting and final ends of the conductor 30 to the connection patterns 29a, 29b provided at the lower surface of the coil terminal sheet 29 through the holes 29c, 29d.

In the present embodiment, the coil terminal sheet 29 may be provided at its one side surface only with the connection patterns 29a, 29b, so that the connection terminal construction according to the present embodiment is far less expensive than the previous embodiment shown in FIG. 3 in which the coil terminal sheet 18 is provided at its upper and lower surfaces with the connection patterns 18a, 18b, respectively. Reference numeral 31 designates a protecting tube wound on the winding portion 28a.

In addition, the coil terminal sheet 29 is provided at its free end with an extension 29e extending together with the patterns 29a, 29b toward the circuit substrate 24 substantially in alignment therewith. The extension 29e is disposed on the upper surface of the circuit substrate 24 and secured thereto by means of a screw 32. Each of the front ends of the connection patterns 29a, 29b provided at the lower surface of the coil terminal sheet 29 is formed into an arcuate segment surrounding a screw 32. Each of the front ends of the wiring patterns 24a, 24b provided on the upper surface of the circuit substrate 24 is also formed into an arcuate segment surrounding the screw 32 and brought into contact with the arcuate shaped front ends of the patterns 29a, 29b by means of the screw 32. Reference numeral 33 designates a washer formed of plastic material and inserted into a hole provided in both the coil terminal sheet 29 and the circuit substrate 24.

Figure 6:
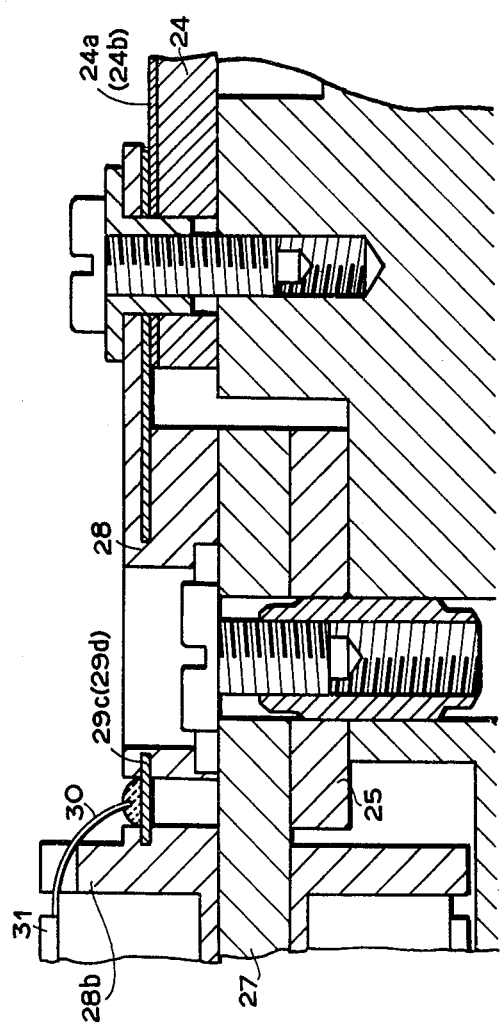
FIG. 6 is a longitudinal sectional view of a modified embodiment.

FIG. 6 is a longitudinal sectional view of a modified embodiment in which like references denote like parts of FIG. 5.

As stated hereinbefore, the invention renders it possible to substantially align the connection pattern provided at the lower surface of the coil terminal sheet with the wiring pattern provided on the upper surface of the circuit substrate, thereby making the connection terminal construction thin in thickness. In addition, the use of such simple construction that the extension including the connection patterns provided on the lower surface thereof is disposed on the circuit substrate and secured thereto by the screw provides the important advantage that it is possible to detachably mount the driving coil on the base plate without removing the circuit substrate. Moreover, since the coil terminal sheet is formed of a flexible print substrate and firmly secured to both the driving coil and the circuit substrate, there is no risk of the coil terminal sheet being broken and hence of the connection being deteriorated even when the coil terminal sheet is subjected to strong shocks. In addition, the use of such construction that the conductor of the driving coil is directly connected through holes provided in the coil terminal sheet to the connection pattern provided at the lower surface of the coil terminal sheet provides another important advantage that the holes serves to contain therein molten solder produced when the soldering process is effected, thereby simplifying the connecting operation. Finally, since the coil terminal sheet may be provided at its one surface only with the connection patterns, such connection pattern construction becomes considerably low in cost.

What is claimed is:

1. A connection terminal construction for driving coils of electronic timepieces including:
   a base plate;
   a magnetic core secured to the upper surface of said base plate;
   a coil wound on said magnetic core;
   a terminal base made of an insulating material, attached to said magnetic core and provided with a conductive portion connected to an end of said coil;
   a circuit substrate secured to the upper surface of said base plate by means of a fixture and provided on the upper surface of said circuit substrate with a conductive wiring pattern connected to said conductive portion; WHEREIN said terminal base further comprises an upper insulating part and a lower insulating part fixed to each surface of said conducting portion respectively, and said upper insulating part is provided with a hole through which said conducting portion is exposed, and said end of said coil being connected to said conductive portion therethrough.

2. A connection terminal construction as claimed in claim 1 wherein said conductive portion extends to said wiring pattern, and said fixture fixing said circuit substrate to the upper surface of said base plate and further fixing said conductive portion to said wiring pattern to make a connection therebetween.

3. A connection terminal construction as claimed in claim 2 wherein said lower insulating part is a reel of said magnetic core, and said upper insulating part and said conductive portion are made integral with each other in advance so as to make said lower insulating part into one body with said upper insulating part and said conductive portion by heat and pressure bonding.

4. A connection terminal construction for driving coils of electronic timepieces, comprising:
   (a) a base plate;
   (b) a circuit substrate mounted on said base plate and provided thereon with wiring patterns;
   (c) a coil terminal sheet made of an insulating material mounted on said circuit substrate and provided with holes extending therethrough, said coil terminal sheet being provided at least one of upper and lower surfaces thereof with conductive connection patterns;
   (d) a driving coil mounted on said base plate, connected through said holes to said conductive connection patterns of said coil terminal sheet, and further connected to said wiring patterns provided on said circuit substrate;
   (e) a magnetic core connected to said conductive connection patterns of said coil terminal sheet; and
   (f) an extension projecting toward said circuit substrate substantially in alignment therewith from said coil terminal sheet, said extension being detachably mounted on said circuit substrate.

5. The connection terminal construction according to claim 4, wherein said extension is disposed on the upper surface of said circuit substrate secured thereto by means of a screw.

6. The connection terminal construction according to claim 4, wherein both the front ends of said connection patterns provided at the lower surface of said coil terminal sheet and the front ends of said wiring patterns provided on the upper surface of said circuit substrate are formed into arcuate segments surrounding a screw and brought into contact with each other by means of said screw.

7. The connection terminal construction according to claim 4, wherein said coil terminal sheet is formed of a flexible print substrate and firmly secured to both said driving coil and said circuit substrate.

* * * * *

UNITED STATES PATENT AND TRADEMARK OFFICE
CERTIFICATE OF CORRECTION

PATENT NO. : 4,199,931
DATED : April 29, 1980
INVENTOR(S) : Akira Yokoyama

It is certified that error appears in the above—identified patent and that said Letters Patent is hereby corrected as shown below:

-- (30) Foreign Application Priority Data

July 8, 1977　　　　Japan　　　　52-90661 ---.

Signed and Sealed this

Twenty-fifth Day of November 1980

[SEAL]

Attest:

SIDNEY A. DIAMOND

Attesting Officer　　　Commissioner of Patents and Trademark: